US007015737B2

(12) United States Patent
Cho

(10) Patent No.: US 7,015,737 B2
(45) Date of Patent: Mar. 21, 2006

(54) DELAY LOCKED LOOP CIRCUIT CAPABLE OF OPERATING IN A LOW FREQUENCY

(75) Inventor: Yong Deok Cho, Icheon-Shi (KR)

(73) Assignee: Hynix Semiconductor Inc., Kyungki-Do (KR)

(*) Notice: Subject to any disclaimer, the term of this patent is extended or adjusted under 35 U.S.C. 154(b) by 0 days.

(21) Appl. No.: 10/876,122

(22) Filed: Jun. 24, 2004

(65) Prior Publication Data

US 2005/0231247 A1 Oct. 20, 2005

(30) Foreign Application Priority Data

Apr. 20, 2004 (KR) ...................... 10-2004-0027087

(51) Int. Cl.
*H03K 7/06* (2006.01)

(52) U.S. Cl. ....................................... 327/158; 375/376

(58) Field of Classification Search ................ 327/158
See application file for complete search history.

(56) References Cited

U.S. PATENT DOCUMENTS

| | | | | |
|---|---|---|---|---|
| 5,955,902 | A * | 9/1999 | Takada et al. | 327/116 |
| 5,970,110 | A * | 10/1999 | Li | 377/48 |
| 6,208,183 | B1 * | 3/2001 | Li et al. | 327/161 |
| 6,501,312 | B1 * | 12/2002 | Nguyen | 327/161 |
| 6,906,566 | B1 * | 6/2005 | Drexler | 327/158 |

* cited by examiner

*Primary Examiner*—Minh Nguyen
(74) *Attorney, Agent, or Firm*—Marshall, Gerstein & Borun LLP

(57) ABSTRACT

A delay-locked loop circuit may include a frequency doubler for increasing a frequency of a clock signal and a frequency divider for decreasing the frequency of the clock signal. The delay-locked loop circuit can be selectively operated in a low frequency and a high frequency by the frequency doubler and the frequency divider.

18 Claims, 3 Drawing Sheets

DELAY LOCKED LOOP CIRCUIT CAPABLE OF OPERATING IN A LOW FREQUENCY

This application relies for priority upon Korean Patent Application No. 2004-0027087 filed on Apr. 20, 2004, the contents of which are herein incorporated by reference in their entirety.

BACKGROUND

1. Field of the Invention

The present invention relates to a delay locked loop (DLL), and more particularly to, a DLL which can remove a skew of a clock and an output data in a read operation of a double data rate synchronous DRAM (DDR SDRAM).

2. Discussion of Related Art

In general, a clock is used as a reference for adjusting an operational timing in a system or circuit, and also used to perform a faster operation without errors. When an external clock is used inside the system or circuit, a time delay (clock skew) occurs by inside circuits. A DLL compensates for the time delay, so that an internal clock can have the same phase as that of the external clock.

The essential factors of the DLL include a small area, a small jitter and a fast locking time, which are performances required by a future semiconductor memory device characterized by a low voltage high speed operation. However, the conventional arts satisfy only part of the factors, or restrict the low voltage high speed operation.

On the other hand, the DLL is less influenced by noises than a phase locked loop (PLL), and thus is widely employed for a synchronous semiconductor memory device such as a DDR SDRAM. Especially, a register controlled DLL has been generally used. The disadvantages of the conventional register controlled DLL will now be explained.

FIG. 1 is a block diagram illustrating the conventional register controlled DLL.

An input buffer 101 buffers external clocks CLK and /CLK. A variable delay line 102 delays the buffered external clocks CLK and /CLK. A replica 105 is modeled to have the same delay time as an access time (tAC) path. A phase detector 103 detects a phase difference between a reference clock ref_clk from the input buffer 101 and a feedback clock fb_clk from the replica 105. A control circuit 104 determines a delay amount of the variable delay line 102 according to the output from the phase detector 103. An output buffer 106 generates an internal clock iCLK by buffering the output from the variable delay line 102.

The operational range of the DLL is determined by the delay time of the variable delay line 102 and the delay time of the replica 105. In general, the operational range of the DLL is prescribed by the spec. of the DDR SDRAM, and has the maximum period of 15 ns. Accordingly, the DLL cannot be normally operated in a test apparatus having a clock period over 30 ns in a wafer test. It is thus impossible to perform logic verification relating to the DLL or defect analysis in a wafer level. In addition, the DLL is not operated in the wafer level, and thus the tAC value is not adjusted, which results in a low yield in a package level.

SUMMARY OF THE INVENTION

The present invention is directed to a delay locked loop which can perform a low frequency operation in a wafer level, by reducing a period of an external clock to a half in a chip through a frequency doubler and applying the external clock to inside circuits, and by restoring an output clock to an original frequency through a frequency divider in a preceding terminal of an output buffer.

One aspect of the present invention is to provide a delay locked loop including: a frequency doubler for increasing the output frequency from an input buffer for buffering a clock; a variable delay line for delaying the output from the frequency doubler; a divider for restoring the output frequency from the variable delay line to the frequency of the clock by dividing the output frequency; an output buffer for buffering the output from the divider; a replica for delaying the output from the variable delay line; a phase detector for detecting a phase difference between the output from the replica and the output from the frequency doubler; and a control circuit for determining a delay amount of the variable delay line according to the output from the phase detector.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Figure 1:
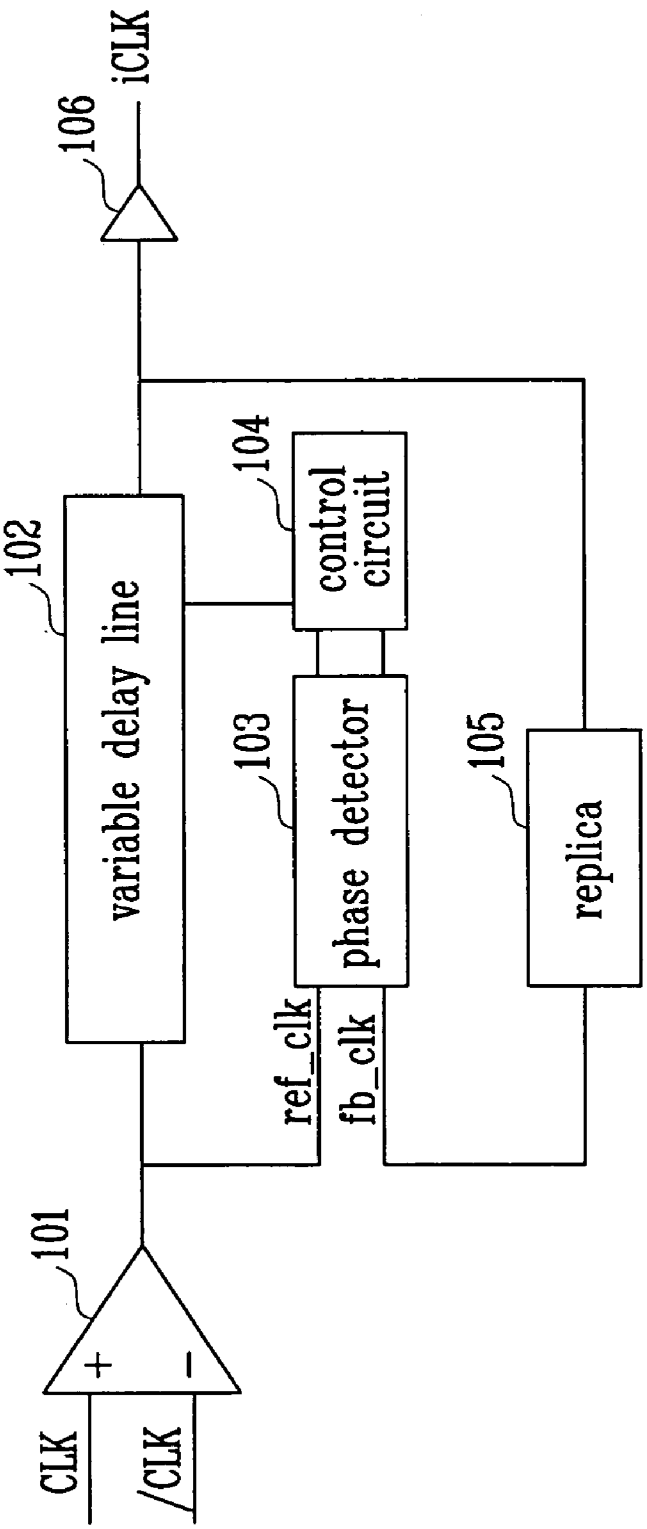
FIG. 1 is a block diagram illustrating a conventional DLL.

A delay locked loop (DLL) in accordance with a preferred embodiment of the present invention will now be described in detail with reference to the accompanying drawings. Wherever possible, the same reference numerals will be used throughout the drawings and the description to refer to the same or like parts.

Figure 2:
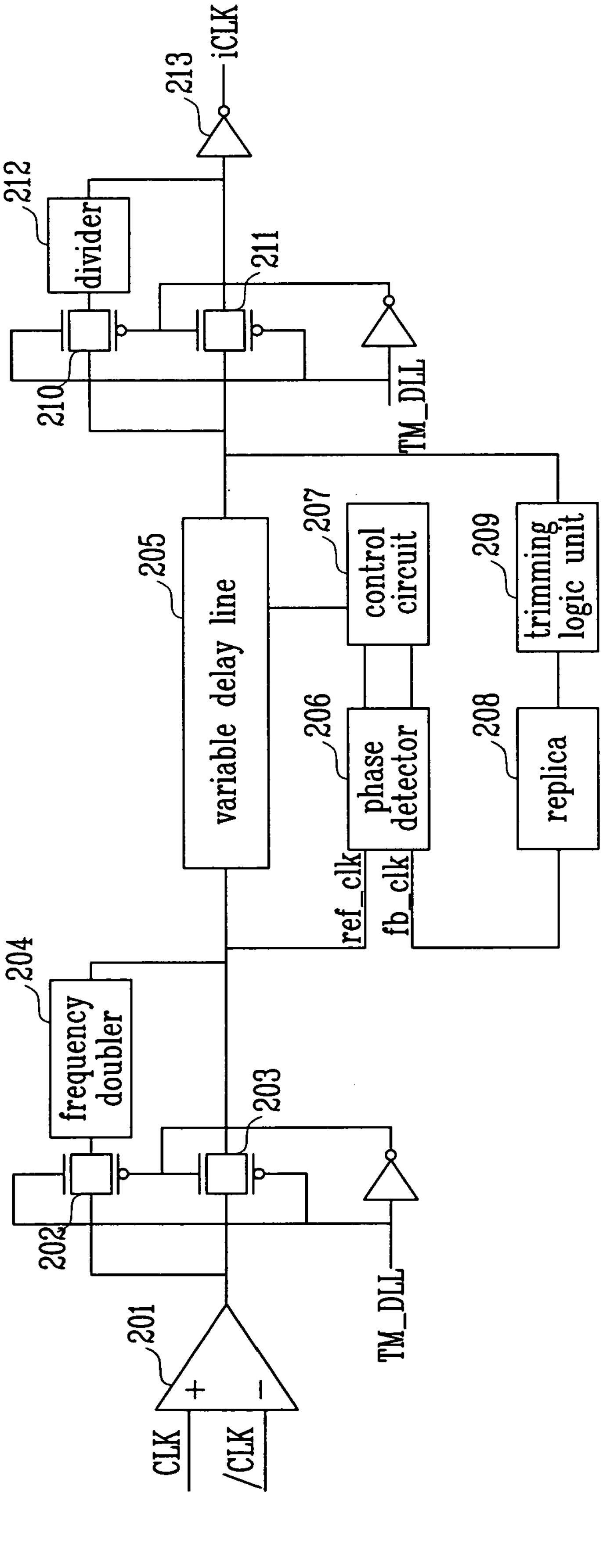
FIG. 2 is a block diagram illustrating a DLL in accordance with a preferred embodiment of the present invention.

FIG. 2 is a block diagram illustrating the DLL in accordance with the preferred embodiment of the present invention.

An input buffer 201 buffers external clocks CLK and /CLK. In a test mode, a test mode signal TM_DLL has a high state, and thus a transmission gate 202 is turned on. In the other modes, the test mode signal TM_DLL maintains a low state, and thus a transmission gate 203 is turned on.

The signal from the transmission gate 202 is increased to, for example, a double frequency by the frequency doubler 204. The output from the frequency doubler 204 or the signal from the transmission gate 203 is transmitted to the variable delay line 205. The variable delay line 205 delays the buffered external clocks CLK and /CLK or the buffered and frequency-doubled external clocks CLK and /CLK. The output from the variable delay line 205 is inputted to a replica 208 through a trimming logic unit 209. The trimming logic unit 209 delays the output from the variable delay line 205 by a predetermined amount. The replica 208 is modeled to have the same delay time as a tAC path. A phase detector 206 detects a phase difference between a reference clock ref_clk from the frequency doubler 204 or the input buffer 201 and a feedback clock fb_clk from the replica 208. A control circuit 207 determines a delay amount of the variable delay line 205 according to the output from the phase detector 206.

When the test mode signal TM_DLL has a high state, a transmission gate 210 is opened, and thus the output from the variable delay line 205 is reduced to, for example, a half by a frequency divider 212. When the test mode signal TM_DLL has a low state, a transmission gate 211 is opened, and thus the output from the variable delay line 205 is transmitted to an output buffer 213 as it is. The output buffer 213 generates an internal clock iCLK by driving the output from the variable delay line 205 or the output from the frequency divider 212.

In accordance with the present invention, in order to guarantee locking of the DLL at a low frequency, the frequency of the input clock is increased to, for example, a double frequency by the frequency doubler 204. The doubled frequency of the input clock is restored to an original frequency by the frequency divider 212. Here, doubling and division of the frequency are executed when the test mode signal TM_DLL has a high level, namely in a wafer state, which does not influence real applications.

Figure 3:
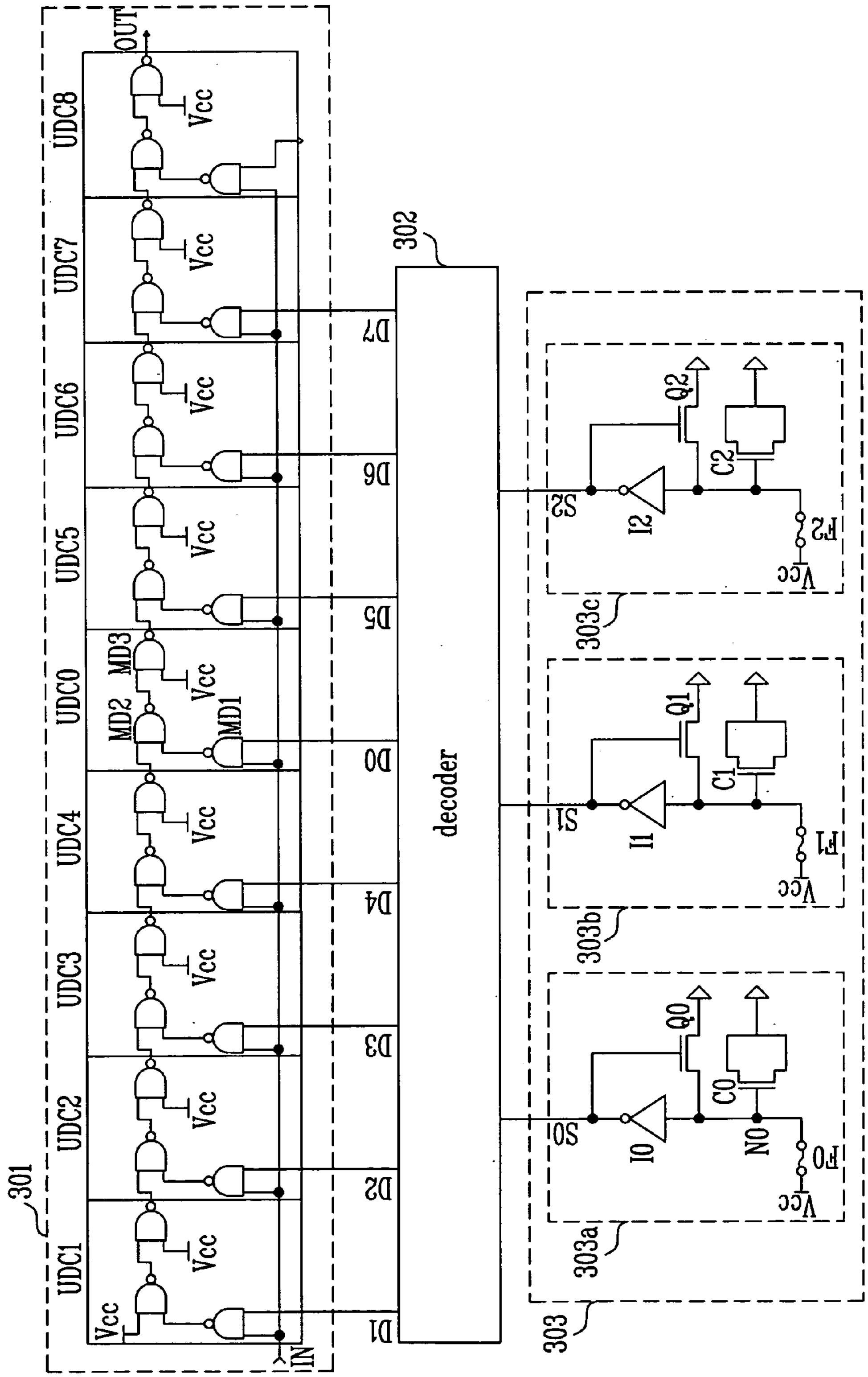
FIG. 3 is a detailed circuit diagram illustrating a trimming logic unit of FIG. 2.

FIG. 3 is a detailed circuit diagram illustrating the trimming logic unit of FIG. 2.

The trimming logic unit includes a unit delay cell array 301, a decoder 302 and a logic circuit 303. The unit delay cell array 301 has a plurality of unit cells UDC0 to UDC8. For example, the decoder 302 outputs eight decoded signals according to three input signals. The logic circuit 303 has a plurality of unit logic circuits 303*a* to 303*c*.

The unit logic circuits 303*a* to 303*c* have the same structure, and thus the structure and operation of the unit logic circuit 303*a* will now be explained.

A fuse F0 is coupled between a power terminal Vcc and a node N0. A capacitor C0 is coupled between the node N0 and a ground terminal. An inverter I0 is coupled between the node N0 and an output terminal S0. An NMOS transistor Q0 operated according to a potential of the output terminal S0 is coupled between the node N0 and the ground terminal. When the fuse F0 is cut, the output terminal S0 has a high state. When the output terminal S0 has a high state, the transistor Q0 is turned on, and thus the node N0 has a low state. Therefore, when the node N0 has a low state, the output terminal S0 is latched in a high state. When the fuse F0 is coupled, charges are charged in the capacitor C0, the node N0 has a high state, and thus the output terminal S0 which is the output from the inverter I0 has a low state.

When each of the fuses F0, F1 and F2 of the unit logic circuits 303*a* to 303*c* is cut, a high level signal is outputted, and when each of the fuses F0, F1 and F2 is coupled, a low level signal is outputted.

The decoder 302 decodes the three outputs S0 to S2 generated in the logic circuit 303, and outputs eight decode signals D0 to D7.

The unit delay cells UDC0 to UDC8 of the delay cell array 301 have the same structure. The unit delay cells UDC0 to UDC8 are dependently coupled between an input terminal IN and an output terminal OUT. That is, the output from the unit delay cell UDC1 becomes the input of the unit delay cell UDC2, and the output from the unit delay cell UDC2 becomes the input of the unit delay cell UDC3. The output from the unit delay cell UDC3 becomes the input of the unit delay cell UDC4, and the output from the unit delay cell UDC4 becomes the input of the unit delay cell UDC0. The output from the unit delay cell UDC0 becomes the input of the unit delay cell UDC5, and the output from the unit delay cell UDC5 becomes the input of the unit delay cell UDC6. The output from the unit delay cell UDC6 becomes the input of the unit delay cell UDC7, and the output from the unit delay cell UDC7 becomes the input of the unit delay cell UDC8. The output from the unit delay cell UDC8 becomes the final output from the delay cell array 301.

The unit delay cell UDC0 includes three NAND gates. One input terminal of the NAND gate ND1 is coupled to the input terminal IN, but the other input terminal thereof is coupled to the output terminal D2 of the decoder 302. One input terminal of the NAND gate ND2 is coupled to the output terminal of the preceding unit delay cell UDC4, but the other input terminal thereof is coupled to the output terminal of the NAND gate ND1. The output from the NAND gate ND2 is inputted to one input terminal of the NAND gate ND3. The other input terminal of the NAND gate ND3 is coupled to the power terminal Vcc, and the output terminal thereof is coupled to the succeeding unit delay cell UDC5.

Each of the unit delay cells UDC0 to UDC8 delays the signal (output from the variable delay line) inputted through the input terminal IN according to the decode signals D0 to D7 from the decoder 302. Here, the delay amount is the same.

The operation of the trimming logic unit will now be described in detail.

The levels of the output terminals S0 to S2 are determined according to cutting or coupling of the fuses F0 to F2 of the unit logic circuits 303*a* to 303*c*. The three outputs from the unit logic circuits 303*a* to 303*c* are inputted to the decoder 302. The decoder 302 outputs the eight decode signals D0 to D7 according to the outputs from the unit logic circuits 303*a* to 303*c*. If the number of the unit logic circuits of the logic circuit 303 is N, the number of the outputs from the decoder 302 is $2^N$.

In the initial state where the fuses F0 to F2 of the unit logic circuits 303*a* to 303*c* are not cut, one output D0 from the decoder 302 has a high level, and the other outputs D1 to D7 have a low level. The output from the variable delay line 205 inputted to the input terminal IN is transmitted to the NAND gate ND1 of the unit delay cell UDC0. Accordingly, the output from the variable delay line 205 sequentially passes through the unit delay cells UDC0, D5 to D8, and is delayed for the delay time of the NAND gates ND2 and ND3 in each unit delay cell. That is, in the initial state where the fuses F0 to F2 of the unit logic circuits 303*a* to 303*c* are not cut, the output from the variable delay line 205 is delayed for a delay time corresponding to a half of the whole delay time of the unit delay cell array 301. As a result, the tAC value can be freely adjusted.

As discussed earlier, in accordance with the present invention, the DLL is normally operated in a wafer test device using a low frequency, so that various items of tests relating to the read operation of the DDR SDRAM can be verified in advance in a non-package state. Accordingly, the test time and cost can be reduced, and defect analysis of the chip can be easily performed. Moreover, AC parameters can be measured in the wafer level, and thus various AC parameters such as tAC or tDQSCK can be tuned by using the fuses, which results in a high package yield.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A delay locked loop, comprising:

an input buffer for buffering a clock signal;

a first switching circuit for transferring a clock signal outputted from the input buffer in response to a control signal;

a frequency doubler for increasing a frequency of the clock signal transferred from the first switching circuit;

a variable delay line for delaying the clock signal outputted from the frequency doubler or from the first switching circuit;

a second switching circuit for transferring the clock signal from the variable delay line in response to the control signal;

a frequency divider for decreasing the frequency of the clock signal outputted from the second switching circuit;

an output buffer for buffering the clock signal outputted from the second switching circuit or from the frequency divider;

a replica for delaying the clock signal outputted from the variable delay line;

a phase detector for detecting a phase difference between the clock signal outputted from the replica and the clock signal outputted from the frequency doubler or from the first switching circuit; and a control circuit for determining a delay amount of the variable delay line according to an output signal of the phase detector.

2. The delay locked loop of claim 1, wherein the replica has a modeling structure of a tAC path.

3. The delay locked loop of claim 1, comprising a trimming logic unit coupled between the variable delay line and the replica, for adjusting a tAC in a wafer level.

4. The delay locked loop of claim 3, wherein the trimming logic unit comprises:

a logic circuit for generating a plurality of logic signals;

a decoder for decoding the outputs from the logic circuit; and a unit delay cell array for delaying the output from the variable delay line according to the outputs from the decoder.

5. The delay locked loop of claim 4, wherein the logic circuit comprises a plurality of unit logic circuits, wherein each of the plurality of unit logic circuits comprises:

a fuse coupled between a power terminal and a node;

a capacitor coupled between the node and a ground terminal;

an inverter coupled between the node and an output terminal; and a transistor coupled between the node and the ground terminal and operated according to a potential of the output terminal.

6. The delay locked loop of claim 4, wherein the unit delay cell array is dependently coupled between the variable delay line and the replica, and comprised of a plurality of unit delay cells.

7. The delay locked loop of claim 6, wherein each of the unit delay cells comprises:

a first NAND gate for receiving the output from the variable delay line and the output from the decoder;

a second NAND gate for receiving the output from the preceding unit delay cell and the output from the first NAND gate; and a third NAND gate for receiving the output from the second NAND gate and power, and outputting the output to the succeeding unit delay cell.

8. The delay locked loop of claim 1, wherein the first switching circuit includes:

a first transfer gate for transferring the clock signal outputted from the buffer to the frequency doubler; and a second transfer gate for transferring the clock signal outputted from the buffer to the variable delay line, wherein, the first transfer gate is operated during a test operation and the second transfer gate is operated during a normal operation, in response to the control signal.

9. The delay locked loop of claim 8, wherein each of the first and second switching circuits comprises transmissions gates.

10. The delay locked loop of claim 1, wherein the second switching circuit includes:

a first transfer gate for transferring the clock signal outputted from the variable delay line to the frequency divider; and a second transfer gate for transferring the clock signal outputted from the variable delay line to the output buffer, wherein, the first transfer gate is operated during a test operation and the second transfer gate is operated during a normal operation, in response to the control signal.

11. A delay locked loop, comprising:

an input buffer for buffering a clock;

a first switch device for switching the output from the input buffer according to a control signal;

a frequency doubler for increasing a frequency of the output from the input buffer passing through the first switch device;

a second switch device for switching the output from the input buffer according to the control signal, the second switch device being operated oppositely to the first switch device;

a variable delay line for delaying the output from the frequency doubler or the output from the input buffer;

a third switch device for switching the output from the variable delay line according to the control signal;

a fourth switch device for switching the output from the variable delay line according to the control signal, the fourth switch device being operated oppositely to the third switch device;

a divider for restoring the output frequency from the variable delay line passing through the third switch device to the frequency of the clock, by dividing the output frequency of the signal from the variable delay line;

an output buffer for buffering the output from the divider or the output from the variable delay line passing through the fourth switch device;

a replica for delaying the output from the variable delay line;

a phase detector for detecting a phase difference between the output from the replica and the output from the frequency doubler; and a control circuit for determining a delay amount of the variable delay line according to the output from the phase detector.

12. The delay locked loop of claim 11, wherein the replica has a modeling structure of a tAC path.

13. The delay locked loop of claim 11, comprising a trimming logic unit coupled between the variable delay line and the replica, for adjusting a tAC in a wafer level.

14. The delay locked loop of claim 13, wherein the trimming logic unit comprises:

a logic circuit for generating a plurality of logic signals;

a decoder for decoding the outputs from the logic circuit; and a unit delay cell array for delaying the output from the variable delay line according to the outputs from the decoder.

15. The delay locked loop of claim 14, wherein the logic circuit comprises a plurality of unit logic circuits, wherein each of the plurality of unit logic circuits comprises:

a fuse coupled between a power terminal and a node;

a capacitor coupled between the node and a ground terminal;

an inverter coupled between the node and an output terminal; and a transistor coupled between the node and the ground terminal and operated according to a potential of the output terminal.

16. The delay locked loop of claim 14, wherein the unit delay cell array is dependently coupled between the variable delay line and the replica, and comprised of a plurality of unit delay cells.

17. The delay locked loop of either claim 16, wherein each of the unit delay cells comprises:

a first NAND gate for receiving the output from the variable delay line and the output from the decoder;

a second NAND gate for receiving the output from the preceding unit delay cell and the output from the first NAND gate; and a third NAND gate for receiving the output from the second NAND gate and power, and outputting the output to the succeeding unit delay cell.

18. The delay locked loop of claim 11, wherein each of the first to fourth switch devices is a transmission gate.

* * * * *

UNITED STATES PATENT AND TRADEMARK OFFICE

CERTIFICATE OF CORRECTION

PATENT NO. : 7,015,737 B2
APPLICATION NO. : 10/876122
DATED : March 21, 2006
INVENTOR(S) : Yong D. Cho It is certified that error appears in the above-identified patent and that said Letters Patent is hereby corrected as shown below:

Title Page:

Item (54), “Delay Locked” should be --Delay-Locked--

In Column 1, line 1, “Delay Locked” should be --Delay-Locked--

In Column 6, line 9, “transmissions” should be -- transmission --;
In Column 8, line 5, “of either claim” should be --of claim--.

Signed and Sealed this

Twenty-third Day of January, 2007

JON W. DUDAS
*Director of the United States Patent and Trademark Office*